(12) United States Patent
Chu et al.

(10) Patent No.: US 12,740,387 B2
(45) Date of Patent: Sep. 15, 2026

(54) FRONTSIDE TO BACKSIDE SIGNAL VIA IN EDGE CELL

(71) Applicant: INTERNATIONAL BUSINESS MACHINES CORPORATION, Armonk, NY (US)

(72) Inventors: Albert M. Chu, Nashua, NH (US); Brent A. Anderson, Jericho, VT (US); Junli Wang, Slingerlands, NY (US); Ruilong Xie, Niskayuna, NY (US); Jay William Strane, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 693 days.

(21) Appl. No.: 18/178,570

(22) Filed: Mar. 6, 2023

(65) Prior Publication Data

US 2024/0304519 A1 Sep. 12, 2024

(51) Int. Cl.

*H10W 20/20* (2026.01)
*H10W 20/00* (2026.01)
*H10W 20/41* (2026.01)
*H10D 84/83* (2025.01)

(52) U.S. Cl.

CPC ......... *H10W 20/20* (2026.01); *H10W 20/023* (2026.01); *H10W 20/427* (2026.01); *H10D 84/83* (2025.01)

(58) Field of Classification Search

CPC ............................ H01L 23/481; H10W 20/20
See application file for complete search history.

(56) References Cited

U.S. PATENT DOCUMENTS 10,665,669 B1 * 5/2020 Xie ........................ H10B 63/34
11,271,567 B1 3/2022 Chen
11,450,753 B2 9/2022 Block
(Continued)

FOREIGN PATENT DOCUMENTS

EP 4044231 A1 8/2022
WO 2022119651 A1 6/2022

OTHER PUBLICATIONS

Pending U.S. Appl. No. 18/064,954, filed Dec. 13, 2022, entitled: "Enlarged Overlap Between Backside Power Rail and Backside Contact", 71 pages.

*Primary Examiner* — Brent A. Fairbanks
*Assistant Examiner* — Krishna J Palaniswamy
(74) *Attorney, Agent, or Firm* — L. Jeffrey Kelly

(57) ABSTRACT

A semiconductor device including a logic block, the logic block includes circuitry for one logic function of a semiconductor device, the logic block comprises a set of circuit rows, and a frontside to backside signal via vertically aligned and directly connecting a first backside metal signal to a first frontside metal signal, where the frontside to backside signal via is only in an edge cell of the logic block. A method including forming a logic block, the logic block includes circuitry for one logic function of a semiconductor device, the logic block comprises a set of circuit rows, and edge cells surrounding the logic block, forming a frontside to backside signal via vertically aligned and directly connecting a first backside metal signal to a first frontside metal signal, where the frontside to backside signal via is in an edge cell of the logic block.

10 Claims, 5 Drawing Sheets

(56) References Cited

U.S. PATENT DOCUMENTS

| | | | | |
|---|---|---|---|---|
| 2012/0206953 | A1 * | 8/2012 | Cheng | G11C 5/148 327/566 |
| 2019/0034572 | A1 * | 1/2019 | Kasprak | G06F 30/398 |
| 2021/0343332 | A1 * | 11/2021 | Chiu | G11C 11/412 |
| 2022/0037307 | A1 * | 2/2022 | Lee | H10D 89/10 |
| 2022/0173113 | A1 | 6/2022 | Yang | |
| 2022/0336474 | A1 * | 10/2022 | Liaw | G11C 11/418 |
| 2023/0046117 | A1 * | 2/2023 | Tao | H10P 50/642 |

* cited by examiner

Section Y1-Y1

Section Y2-Y2

FRONTSIDE TO BACKSIDE SIGNAL VIA IN EDGE CELL

BACKGROUND

The present invention relates, generally, to the field of semiconductor manufacturing, and more particularly to a frontside to backside signal via.

Complementary Metal-oxide-semiconductor (CMOS) technology is commonly used for FET as part of advanced integrated circuits (hereinafter "IC"), such as central processing units (hereinafter "CPUs"), memory, storage devices, and the like. As demands to reduce the dimensions of transistor devices continue, several frontside to backside signal vias may be placed within a logic block. Placement of frontside to backside signal vias within a logic block fractures backside power rails, resulting in a large area impact as the signal via and metal must be separated from the backside power rail by a specific distance. Frontside to backside signal vias within the logic block reduce a maximum number of circuits within the logic block, prevent some of the circuitry from being directly adjacent to other related circuitry and result in wiring between circuits and FETs to be routed around the frontside to backside signal vias.

SUMMARY

According to an embodiment, a semiconductor device is provided. The semiconductor device includes a logic block, where the logic block includes circuitry for one logic function of a semiconductor device, where the logic block comprises a set of circuit rows, a set of backside metal Vdd power rails, a set of backside metal Vss power rails, and a frontside to backside signal via vertically aligned and directly connecting a first backside metal signal to a first frontside metal signal, where the frontside to backside signal via is only in an edge cell of the logic block.

According to an embodiment, a semiconductor device is provided. The semiconductor device includes a first backside power rail, a logic block, wherein the logic block comprises circuitry for one logic function of a semiconductor device, where the logic block comprises a set of circuit rows, a set of backside metal Vdd power rails, a set of backside metal Vss power rails, and edge cells surrounding the logic block, a first macro cell within the first logic block, where first macro cell edge cells surround the first macro cell, and a frontside to backside signal via vertically aligned and directly connecting a first backside metal signal to a first frontside metal signal, where the frontside to backside signal via is in an edge cell of the logic block.

According to an embodiment, a method is provided. The method forming a logic block, the logic block includes circuitry for one logic function of a semiconductor device, the logic block comprises a set of circuit rows, and edge cells surrounding the logic block, forming a frontside to backside signal via vertically aligned and directly connecting a first backside metal signal to a first frontside metal signal, where the frontside to backside signal via is in an edge cell of the logic block.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
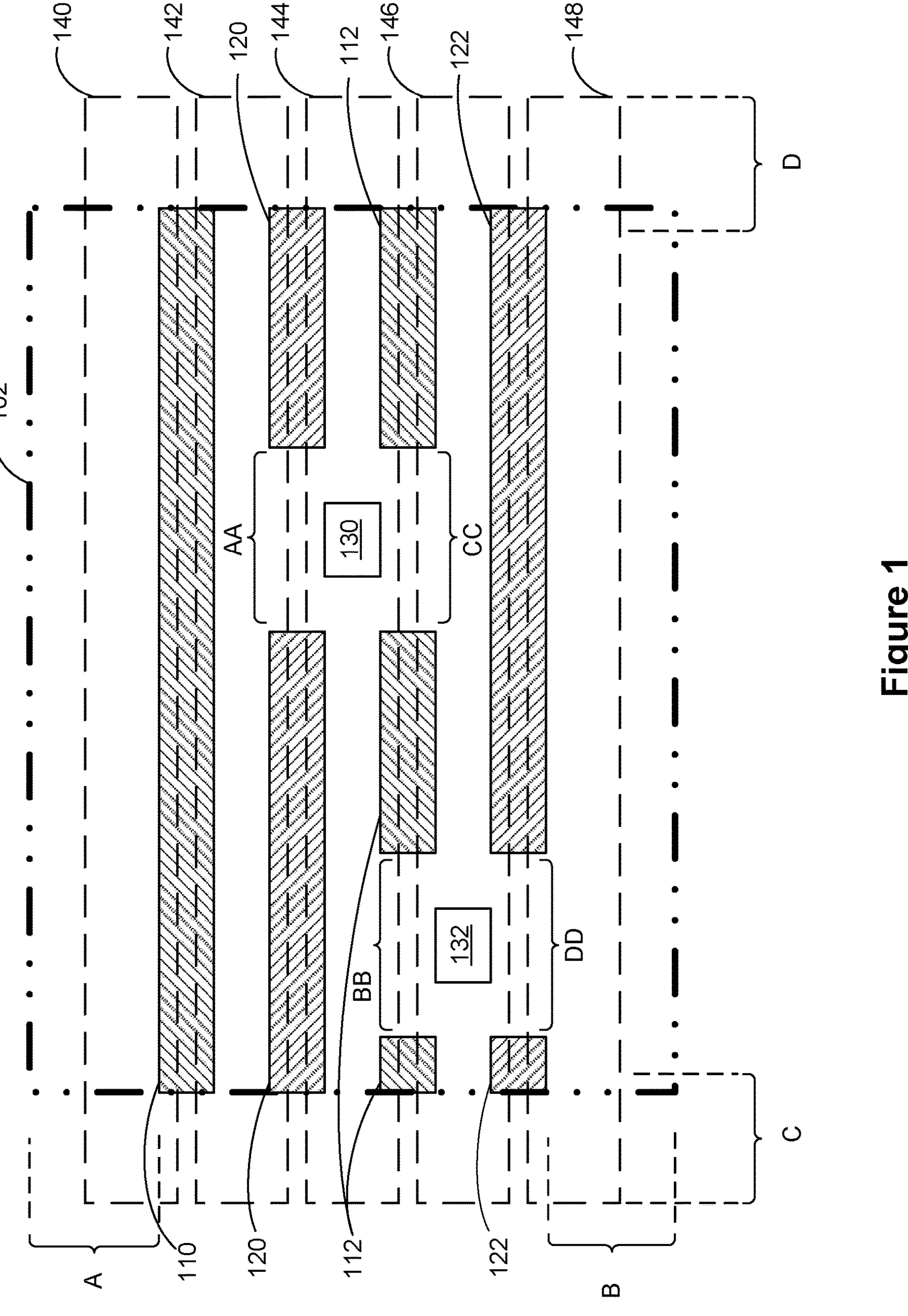
FIG. 1 illustrates a top view of a logic block at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates, generally, to the field of semiconductor manufacturing, and more particularly to a frontside to backside signal via.

Complementary Metal-oxide-semiconductor (CMOS) technology is commonly used for FET as part of advanced integrated circuits (hereinafter "IC"), such as central processing units (hereinafter "CPUs"), memory, storage devices, and the like. Nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

As demands to reduce the dimensions of transistor devices continue, frontside to backside signal vias may be placed within a logic block. Placement of frontside to backside signal vias within a logic block fractures backside power rails, resulting in a large area impact as the signal via and metal must be separated from the backside power rails by a specific distance. Frontside to backside signal vias within the logic block reduce a maximum number of circuits within the logic block, prevents some circuitry from being directly adjacent to other related circuitry and result in wiring between circuits and FETs to be routed around the frontside to backside signal vias. For example, a logic block with 1000 circuit rows and 1000 nanosheet FETs within each circuit row may have a maximum number of 1,000,000 nanosheet FETs within the logic block. If there are frontside to backside signal vias within the logic block, the maximum number of nanosheet FETs may be reduced to 800,000, in an example. Limiting placement of the frontside to backside signal vias along boundaries of the logic cell will allow the logic block to contain the maximum number of 1,000,000 nanosheet FETs.

This invention provides a structure and method to place frontside to backside signal vias in edge cells of a logic block. Frontside to backside signal vias connect signal circuitry through layers of the semiconductor device.

The semiconductor device is organized in circuit rows. Each of the circuit rows contains cells. A cell is a group of transistor and interconnect structures which provides a Boolean logic function. Each cell of each circuit row is connected to a Vdd power supply rail and a Vss power supply rail. The semiconductor device has several Vdd power supply rails and several Vss power supply rails. The semiconductor device may contain a single logic block or may contains hundreds or thousands of logic blocks. Each logic block contains cells across several circuit rows. Each logic block performs a specific function, such as a microprocessor, a memory, a device driver, input or output logic, a multiplier, a digital signal processor (DSP) block, among other functions. Each logic block may have hundreds or thousands of FETs, and may include nanosheet FETs. Traditionally, frontside to backside signal vias are placed within a logic block, resulting in fractured Vdd and Vss supply rails within the logic block. In this invention, frontside to backside signal vias are placed along edge cells surrounding the logic block or around a perimeter of the logic block. This allows the Vdd and Vss or ground power supply rails to be continuous without breaks within the logic block.

An edge cell may be referred to as an end cap cell or a boundary cell and is placed at both ends of each circuit row to terminate a row. An edge cell is also placed along a top or bottom row of a logic block, normally placed for integration with other logic blocks.

A frontside to backside signal via is a direct connection vertically aligned between a frontside and a backside of the semiconductor device, connecting a frontside metal signal line and a backside metal signal line. The frontside of the semiconductor device consists of device layers and BEOL (Back End Of Line) layers. The backside of the semiconductor device consists of backside metal layers which can be used for power (i.e. Vdd or Vss) or signals. Frontside to backside signal vias also connect signal lines to each other. There may be multiple layers of circuitry. There are multiple sets of power rails (Vdd and Vss) on both the frontside and the backside and also within each layer of circuitry within the semiconductor device structure. There may be frontside to backside power supply rail vias formed within a logic block and formed within edge cells.

Frontside to backside signal vias can be on multiple sides of a primary logic region or logic block and can be of different sizes. Multiple frontside to backside signal vias can be in each edge cell. The edge cells of a logic block will contain backside metals, such that the frontside to backside signal via in the edge cell can connect to one of these backside signal metal layers. The frontside to backside signal via is a self-aligned direct backside contact (DBC). The frontside to backside signal via may be formed using a nano-TSV process and may be referred to as a nano through silicon via (nTSV). There may be signal vias within a logic block, but not through the entire semiconductor structure.

The semiconductor device may include several layers of circuitry, each layer of circuitry is organized in circuit rows. Within in each circuit row, there are cells, which may be referred to as organized in columns. A logic block may include portions of more than one layer of circuitry of the semiconductor device. For example, the semiconductor may have 20 layers of circuitry and a logic block may be across 15 layers. Accordingly, there may be signal vias within a logic block, but not through the entire semiconductor structure, according to this invention.

The method includes forming frontside to backside signal vias on left/right edge cells and top/bottom edge cells of a logic block and forming continuous backside power rails with no breaks within a logic block. Specifically, this method includes forming no frontside to backside signal via within the logic block.

Embodiments of the present invention disclose a structure and a method of forming a frontside to backside signal vias along boundaries of a logic block.

Referring now to FIG. 1, a logic block 102 at an intermediate stage of fabrication is shown according to an exemplary embodiment. FIG. 1 is a top view of the logic block 102. The logic block 102 may be formed or provided.

Several steps have been completed to form the logic block 102 of FIG. 1. The logic block 102 is a portion of a semiconductor with other surrounding logic blocks (not shown). The logic block contains several layers of fabrication. The logic block 102 includes Vdd power supply rail 110, Vss power supply rail 120, Vdd power supply rail 112 and Vss power supply rail 122. The Vss power supply rail 120, the Vdd power supply rail 112 and the Vss power supply rail 122 each have breaks in the power supply rails, such that the power supply rails are not continuous. The breaks in the power supply rails are within the logic block 102. The Vss power supply rail 120 has break AA. The Vdd power supply rail 112 has break BB and break CC. The Vss power supply 124 has break DD.

A frontside to backside signal via 130 may be positioned in an area of the break AA and the break CC. The frontside to backside signal via 130 position within an area of the Vss power supply rail 120 and the Vdd power supply rail 112 results in those power supply rails being discontinuous. A frontside to backside signal via 132 may be positioned in an area of the break BB and the break DD. The frontside to backside signal via 132 results in the Vdd power supply rail 112 and the Vss power supply rail 122 each being discontinuous. As shown in this embodiment of the logic block 102, there may be more than one break within a power rail, as shown in the Vdd power supply rail 112, which has the break CC and the break BB. The frontside to backside signal via 130 and the frontside to backside signal via 132 are each a frontside to backside signal via within the logic block 102.

The logic block 102 has a circuit row 140, a circuit row 142, a circuit row 144, a circuit row 146 and a circuit row 148. Each of the circuit rows 140, 142, 144, 146, may have FETs and other logic elements along the circuit row. Each of the circuit rows 140, 142, 144, 146 has access to one of the Vdd power supply rails 110, 112, and to one of the Vss power supply rails 120, 122, as they overlap the power supply rails. As shown in the embodiment of the logic block 102, circuitry along the circuit rows 144, 146, 148 have an interruption of the circuit row due to the frontside to backside signal vias 130, 132. The interruption of the circuit row 142, 144, 146, 148, results in additional and longer wiring to connect logic elements within the respective circuit row. The interruption of each circuit row 142, 144, 146, 148, reduces a number of FETs and other logic elements which can be formed in each circuit row 142, 144, 146, 148.

There are four areas identifying top/bottom edge cells and left/right edge cells of the logic block 102. The four areas are area A, area B, area C, area D.

In an embodiment, a size of the logic block 102 may be 1000 circuit rows with 1000 columns of cells. In an alternate embodiment, the logic block 102 may contain 15 circuit rows and 15 columns of cells. In an embodiment, there may be 100 Vdd and 100 Vss power supply rails in the logic block 102. In an embodiment, the logic block 102 may contain 5 layers of circuitry.

Figure 2:
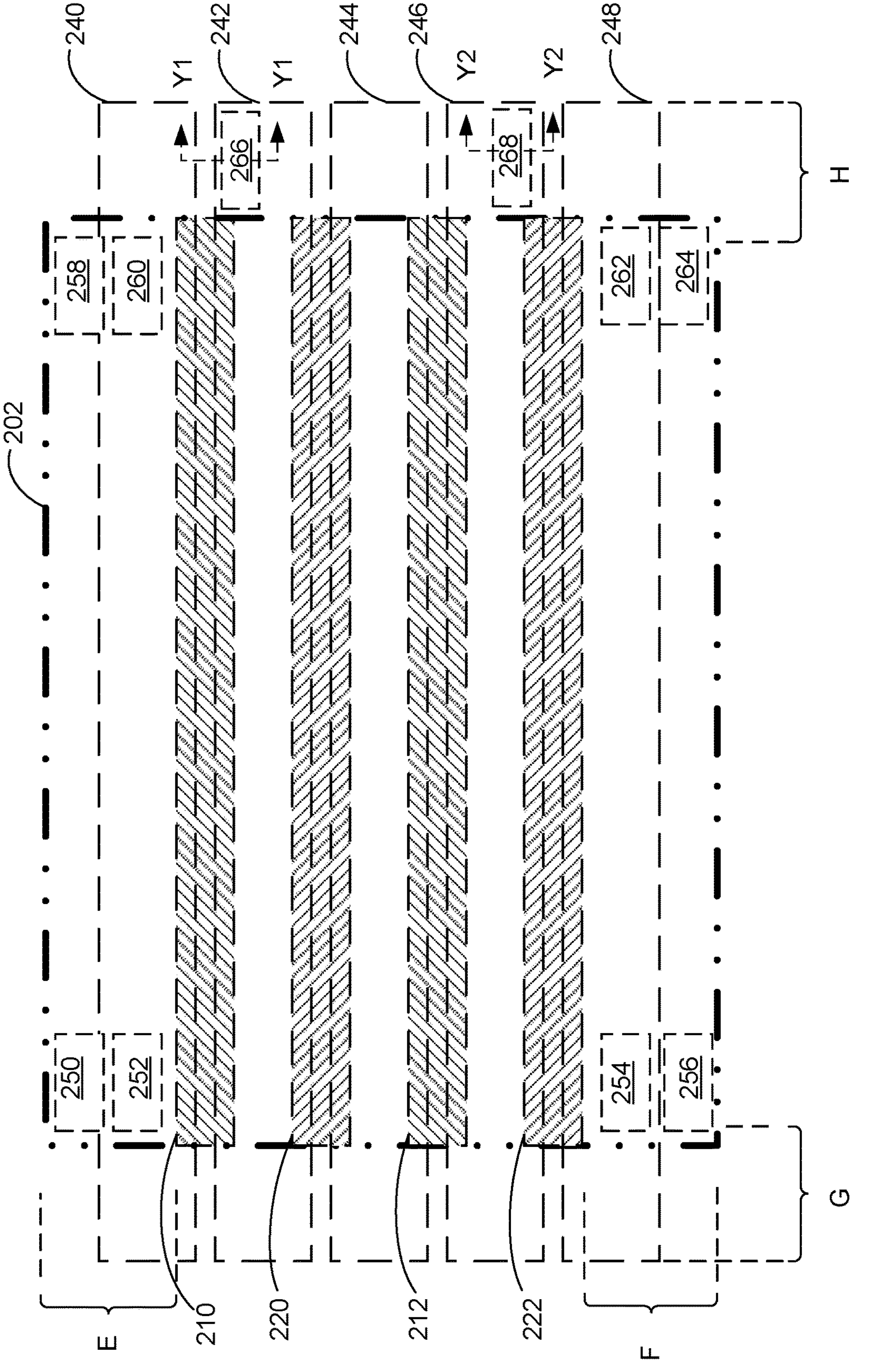
FIG. 2 illustrates a top view of another logic block at an intermediate stage of fabrication, according to an exemplary embodiment.

Referring now to FIG. 2, a logic block 202 at an intermediate stage of fabrication is shown according to an exemplary embodiment. FIG. 2 is a top view of the logic block 202. The logic block 202 may be formed or provided.

Several steps have been completed to form the logic block 202 of FIG. 2. The logic block 202 is a portion of a semiconductor with other surrounding logic blocks (not shown). The logic block contains several layers of fabrication and circuitry. The logic block 202 includes Vdd power supply rail 210, Vss supply rail 220, Vdd power supply rail 212 and Vss power supply rail 222. The Vdd power supply rail 210, the Vss supply rail 220, the Vdd power supply rail 212 and the Vss power supply rail 222 each do not have breaks in the power supply rails, such that the power supply rails are continuous across the logic block 202.

The logic block 202 has a circuit row 240, a circuit row 242, a circuit row 244, a circuit row 246 and a circuit row 248. Each of the circuit rows 240, 242, 244, 246, may have FETs and other logic elements along the circuit row. Each of the circuit rows 240, 242, 244, 246, may have access to one of the Vdd power supply rails 210, 212, and to one of the Vss power supply rails 220, 222, as they may overlap the power supply rails. As shown in the embodiment of the logic block 202, circuitry along the circuit rows 242, 244, 246, 248 does not have an interruption of the circuit row due to a frontside to backside signal via. There is a maximum number of FETs and other logic elements which can be formed in each circuit row 242, 244, 246, 248 due to no break in any of the Vdd power supply rail 210, the Vss supply rail 220, the Vdd power supply rail 212 and the Vss power supply rail 222.

The logic block 202 may have frontside to backside signal vias along edge cells of the logic block. The logic block 202 may not have frontside to backside signal vias within a central region of the logic block. A frontside to backside signal via 250, a frontside to backside signal via 252, a frontside to backside signal via 254, a frontside to backside signal via 256, a frontside to backside signal via 258, a frontside to backside signal via 260, a frontside to backside signal via 262 and a frontside to backside signal via 264 may each be a frontside to backside signal via, and may each be along top or bottom edge cells of the logic block 202. The top/bottom edge cells are area E and area F of the logic block 202. A frontside to backside signal via 266 and a frontside to backside signal via 268 may be along left/right edge cells of the logic block 202. The left/right edge cells of the logic block 202 are area G and area H. The frontside to backside signal via 266 and a frontside to backside signal via 268 may each connect a frontside metal signal line and a backside metal signal line.

In an embodiment, the logic block 202 may have hundreds of circuit rows, for example 600 circuit rows. In an embodiment, the logic block may contain hundreds of circuit rows, for example 600 circuit rows and have thousands FETs, for example 2,000 FETs or nanosheet FETs within each circuit row. In an embodiment, there may be as many Vdd power supply rails and as many Vss power supply rails, as the number of circuit rows, in the logic block 202. In an embodiment, an entire semiconductor device or chip may have a single logic block 202.

Within the logic block 202, all of the power supply rails, i.e. the Vdd power supply rails 210, 212, and the Vss power supply rails 220, 222, are continuous and do not have any breaks across the logic block 202.

Figure 3:
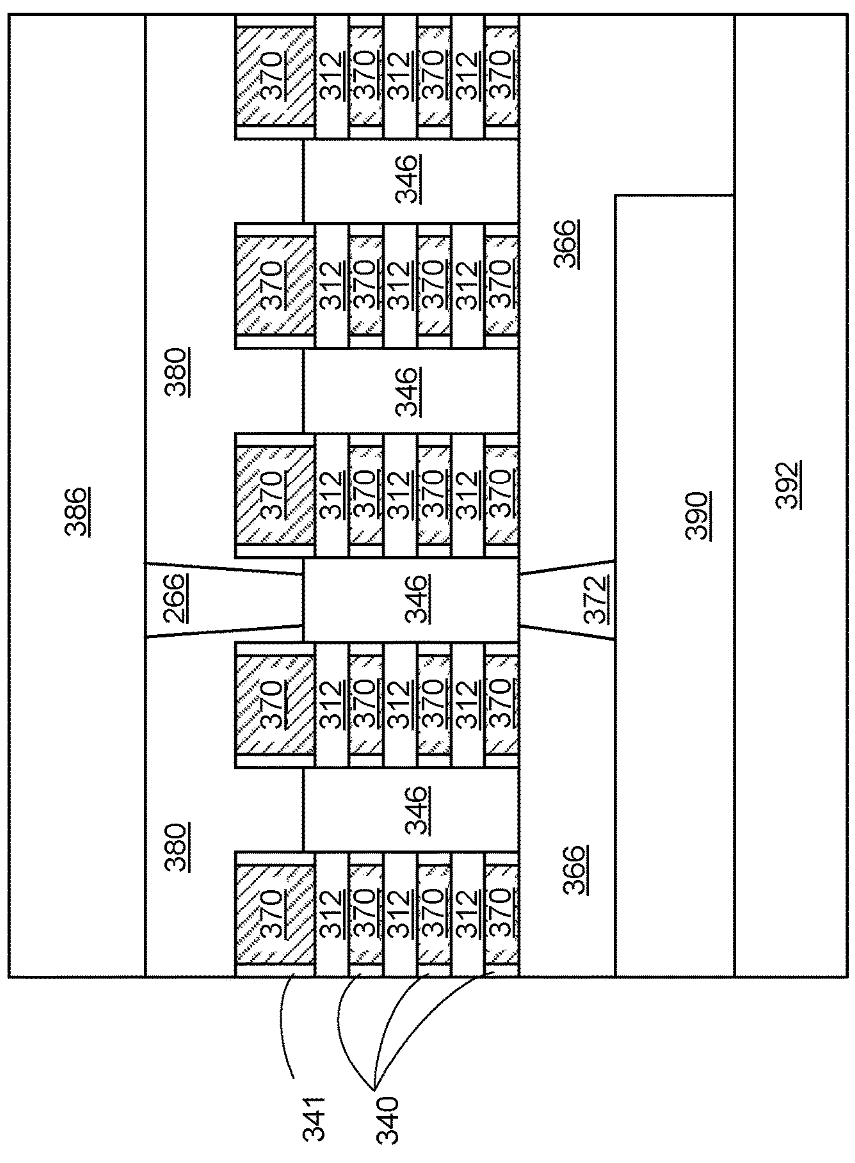
FIG. 3 illustrates a cross-sectional view of a portion of the semiconductor structure of FIG. 2 along section line Y1-Y1, according to an embodiment.

Referring now to FIG. 3, a structure 300 at an intermediate stage of fabrication is shown according to an exemplary embodiment. FIG. 3 is a cross-sectional view of a portion of the logic block 202 along section line Y1-Y1 of FIG. 2.

The structure 300 includes fabricated nanosheet devices with the contact (hereinafter "CA") 266. The CA 266 is the frontside to backside signal via 266 of FIG. 2. This is an example of a structure with a frontside to backside signal via.

The structure 300 includes three channel layers 312 arranged in a vertically aligned stack between alternating rows of replacement gate 370 with vertically aligned surrounding inner spacers 340. The replacement gate 370 is vertically aligned above the three channel layers 312 with vertically aligned surrounding gate side spacers 341. This forms a nanosheet stack which is separated from adjacent nanosheet stacks by a source drain 346. There may be any number of alternating channel layers 312 with replacement gate 370 with inner spacers 340 between channel layers 312. There may be any number of nanosheet stacks in the structure 300.

The inner spacer 340 may completely fill in spaces between the channel layers 312, where the portions of the sacrificial layers (not shown) had been previously removed. A vertical side surface of the inner spacer 340 may be aligned with a vertical side surface of the channel layers 312 and a vertical side surface of the source drain 346. The replacement gate 370 may be adjacent to vertical side surfaces of one side of each of the side spacers 340, and be adjacent to a vertical surface of one side of the gate side spacers 341. The replacement gate 370 may cover vertical side surfaces, an upper horizontal surface and a lower horizontal surface of the channel layers 312.

An interlayer dielectric (hereinafter "ILD") 366 is horizontally below the adjacent nanosheet stacks. The ILD 366 is below a lowermost replacement gate 370 and surrounding inner spacers 340. The ILD 366 is below the source drain 346. A backside metal line, referred to as BM1 390 may be formed in a lower portion the ILD 366, such that the ILD 366 is horizontally above the BM1 390 and vertically adjacent to the BM1 390. Backside power delivery network (hereinafter "BSPDN") 392 is horizontally below the BM1 390 and horizontally below the ILD 366. A bottom contact (hereinafter "BCA") 372 may connect a first source drain 346 to the BM1 390.

The BM1 390 may be formed by methods known in the arts and include several steps. The BM1 390 may be formed by a damascene process with metal such as Cu, Co, or W, followed by CMP. Damascene process is a conventional metallization process which trenches (or vias) are formed first in an interlayer dielectric (ILD) followed by metal deposition and CMP. In an embodiment, a thin metal liner such as TiN may be deposited prior to bulk metal fill. The thin metal liner (not shown) may include an adhesion liner, such as TiN, or TaN. The BM1 390 is a signal line.

An interlayer dielectric (hereinafter "ILD") 380 is horizontally above the adjacent nanosheet stacks. The ILD 380 is horizontally above the replacement gate 370. The ILD 380 is horizontally above and vertically adjacent to one side of the gate side spacers 341. The ILD 380 is horizontally above the source drain 346. Back end of line layers (hereinafter "BEOL") 386 may be horizontally above the ILD 380. The CA 266 may connect the first source drain 346 to the BEOL 386. The CA 266 is connected to the same first source drain 346 which is connected to the BM1 390. The BEOL 386 may be referred to as a frontside interconnect layer 386. The BEOL 386 may include layers of wiring and vias formed above the existing structure, above the CA 266 and the ILD 380. In an embodiment, the BEOL 386 may include 12 or more layers of metal lines and visas vias. The BEOL 386 may be formed using known techniques.

The frontside to backside signal via 266 of FIG. 2 includes the CA 266, the first source drain 346 and the BCA 372. The structure 300 includes fabricated nanosheet devices with a vertically aligned frontside to backside signal via and is formed along left/right edge cells of the logic block 202.

The CA 266 and the BCA 372 may each have more than one layer. The CA 266 and the BCA 372 may include a silicide liner such as Ti, Ni, NiPt, an adhesion liner, such as TiN and a conductive metal, such as W, Co, Ru, or Mo.

Figure 4:
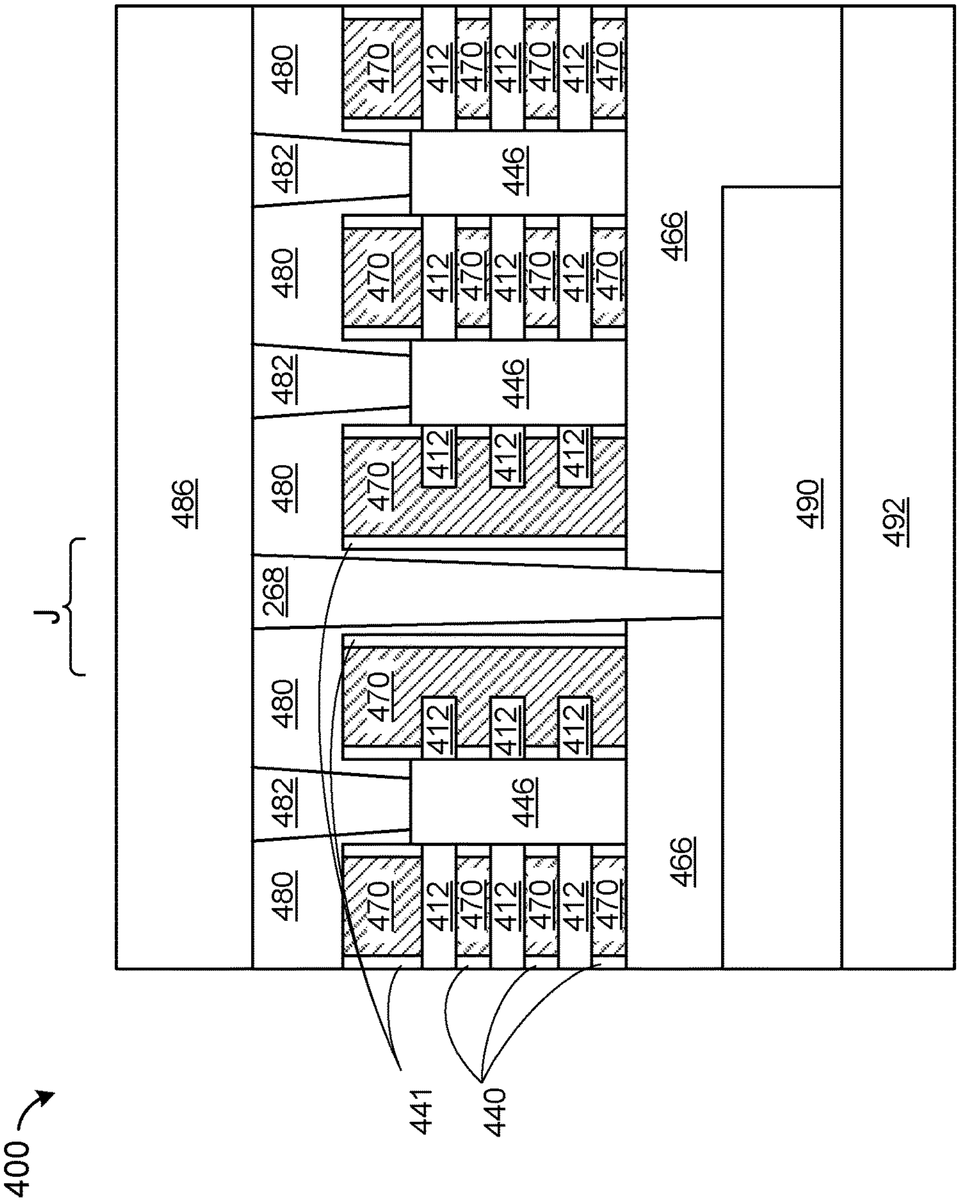
FIG. 4 illustrates a cross-sectional view of a portion of the semiconductor structure of FIG. 2 along section line Y2-Y2, according to an embodiment.

Referring now to FIG. 4, a structure 400 at an intermediate stage of fabrication is shown according to an exemplary embodiment. FIG. 4 is a cross-sectional view of a portion of the logic block 202 along section line Y2-Y2 of FIG. 2.

The structure 400 includes fabricated nanosheet devices with the frontside to backside signal via 268 of FIG. 2. This is another example of a structure with a frontside to backside signal via.

The structure 400 includes three channel layers 412 arranged in a vertically aligned stack between alternating rows of replacement gate 470 with vertically aligned surrounding inner spacers 440. The replacement gate 470 is vertically aligned above the three channel layers 412 with vertically aligned surrounding gate side spacers 441. This forms a nanosheet stack which is separated from adjacent nanosheet stacks by a source drain 446. There may be any number of alternating channel layers 412 with replacement gate 470 with inner spacers 440 between channel layers 412. There may be any number of nanosheet stacks in the structure 400.

The inner spacer 440 may completely fill in spaces between the channel layers 412, where the portions of the sacrificial layers (not shown) had been previously removed. A vertical side surface of the inner spacer 440 may be aligned with a vertical side surface of the channel layers 412 and a vertical side surface of the source drain 446. The replacement gate 470 may be adjacent to vertical side surfaces of one side of each of the side spacers 440, and be adjacent to a vertical surface of one side of the gate side spacers 441. The replacement gate 470 may cover vertical side surfaces, an upper horizontal surface and a lower horizontal surface of the channel layers 412.

An interlayer dielectric (hereinafter "ILD") 466 is horizontally below the adjacent nanosheet stacks. The ILD 466 is below a lowermost replacement gate 470 and surrounding inner spacers 440. The ILD 466 is below the source drain 446. A backside metal line, referred to as BM1 490 may be formed in a lower portion the ILD 466, such that the ILD 466 is horizontally above the BM1 490 and vertically adjacent to the BM1 490. Backside power delivery network (hereinafter "BSPDN") 492 is horizontally below the BM1 490 and horizontally below the ILD 466.

The BM1 490 may be formed by methods known in the arts and include several steps. The BM1 490 may be formed by a damascene process with metal such as Cu, Co, or W, followed by CMP. Damascene process is a conventional metallization process which trenches (or vias) are formed first in an interlayer dielectric (ILD) followed by metal deposition and CMP. In an embodiment, a thin metal liner such as TiN may be deposited prior to bulk metal fill. The thin metal liner (not shown) may include an adhesion liner, such as TiN, or TaN. The BM1 490 may be Vdd power supply, or may be Vss or ground power supply.

An interlayer dielectric (hereinafter "ILD") 480 is horizontally above the adjacent nanosheet stacks. The ILD 480 is horizontally above the replacement gate 470. The ILD 480 is horizontally above and vertically adjacent to one side of the gate side spacers 441. The ILD 480 is horizontally above the source drain 446. Back end of line layers (hereinafter "BEOL") 486 may be horizontally above the ILD 480. The BEOL 486 may be referred to as a frontside interconnect layer 486. The BEOL 486 may include layers of wiring and vias formed above the existing structure, above the frontside to backside signal via 268 and the ILD 480. In an embodiment, the BEOL 486 may include 12 or more layers of metal lines and visas. The BEOL 486 may be formed using known techniques.

The frontside to backside signal via 268 of FIGS. 2 and 4 may connect the BM1 490 to the BEOL 486. The structure 400 includes fabricated nanosheet devices with the vertically aligned frontside to backside signal via 268 and is formed along left/right edge cells of the logic block 202.

The frontside to backside signal via 268 may each have more than one layer. The frontside to backside signal via 268 may include a silicide liner such as Ti, Ni, NiPt, an adhesion liner, such as TiN and a conductive metal, such as W, Co, Ru, or Mo.

A section J of the structure 400 surrounds the frontside to backside signal via 268. The section J has had portions of each of the channel layers 412 removed. As shown in FIG. 4, the frontside to backside signal via 268 is surrounded by the ILD 480. The gate side spacers 441 surround the replacement gate 470. In the section J, portions of the channel layers 412 have been removed in the replacement gate 470, with surrounding gate side spacers 441, which surround the ILD 480. The sections of the replacement gate 470 without the portions of the channel layers 412 are each referred to as a double diffusion break.

The structure 300 of FIG. 3 and the structure 400 of FIG. 4 each illustrate an example of a frontside to backside signal via 266 and frontside to backside signal via 268, which may be placed in the top/bottom edge cells or in the left/right edge cells of the logic block 202. Placing frontside to backside signal via along edge cells of the logic block 202 and not placing frontside to backside signal vias within a logic block has many advantages. The advantages include power supply rails which are continuous through the logic block and forming a maximum amount of logic circuitry within the logic block.

Figure 5:
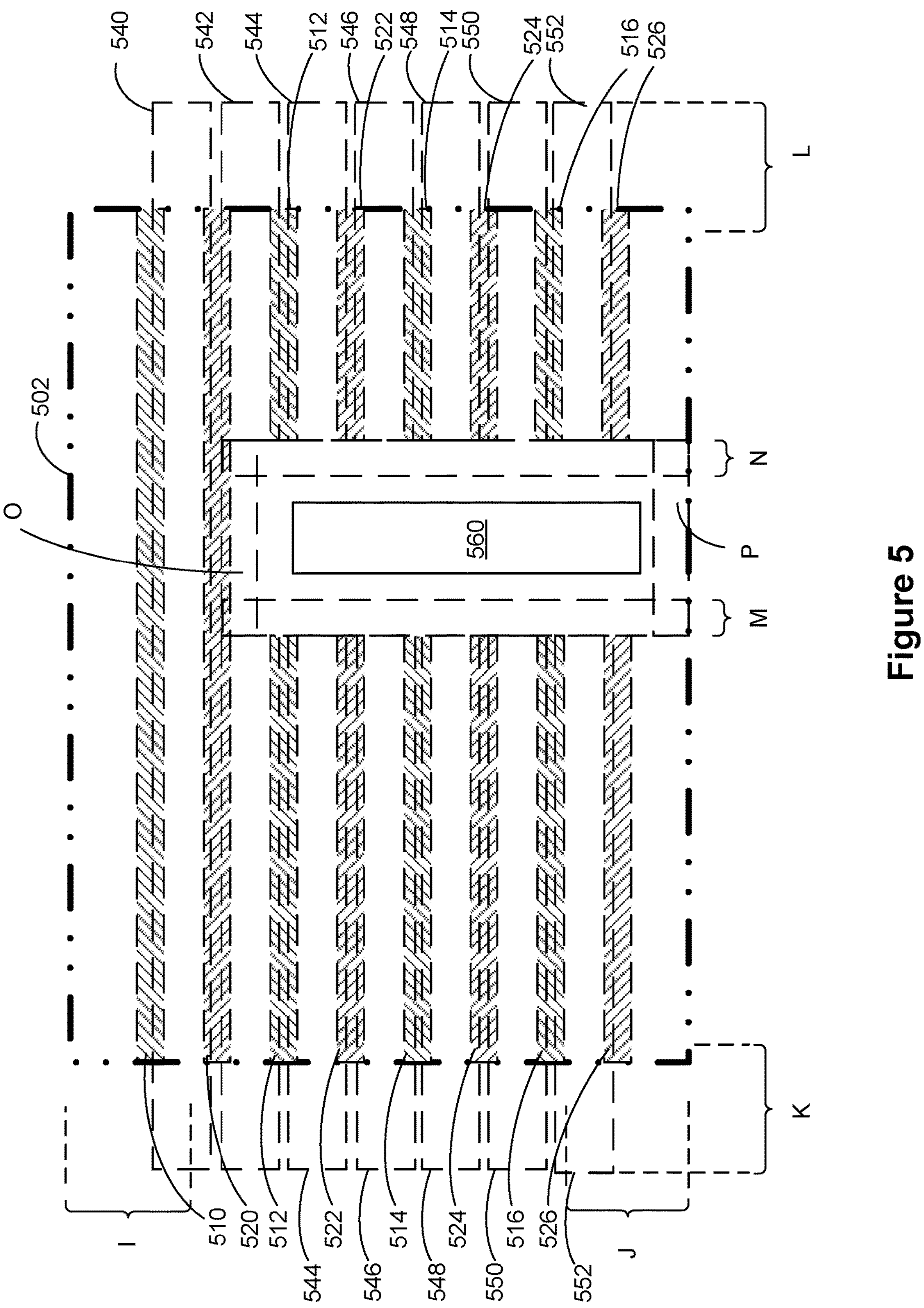
FIG. 5 illustrates a top view of a portion of another logic block at an intermediate stage of fabrication, according to an embodiment.

Referring now to FIG. 5, a logic block 502 at an intermediate stage of fabrication is shown according to an exemplary embodiment. FIG. 5 is a top view of the logic block 502. The logic block 502 may be formed or provided.

FIG. 5 is an alternative embodiment than shown in FIG. 2. FIG. 5 illustrates a logic block 502 which includes a macro cell 560. There are macro cell edge cells in area M, area N, area O and area P. There may be frontside to backside signal vias in the macro cell edge cells which are within the logic block 502.

The macro cell 560 is formed within the logic block 502. The macro cell 560 may be formed within the logic block 502 which would be a specific subset function for the function of the logic block 502 by having the macro cell 560 within the logic block 502. The macro cell 560 has a specific logical function. For example, the macro cell 560 may be a middle memory. There may be interruption of the Vdd power supply rails and Vss power supply rails in order to place the macro cell 560 within the logic block 502. Edge cells of the macro cell 560 may be place on left/right sides, and/or on top/bottom sides of the macro cell 560. In FIG. 5, illustrated are macro cell edge cells in area M and in area N, area O, area P. There may be frontside to backside signal vias in the macro cell edge cells of the macro cell 560. There may be more than one macro cell 560 in the logic block 502, and each may have macro cell edge cells which may contain frontside to backside vias.

Several steps have been completed to form the logic block 502 of FIG. 5. The logic block 502 is a portion of a semiconductor with other surrounding logic blocks (not shown). The logic block contains several layers of fabrication and circuitry. The logic block 502 includes Vdd power supply rail 510, Vss supply rail 520, Vdd power supply rail 512, Vss power supply rail 522, Vdd power supply rail 514, Vss supply rail 524, Vdd power supply rail 516, and Vss power supply rail 526. The Vdd power supply rails 512, 514, 516 and the Vss supply rails 524, 526 each only have breaks in the power supply rails in the areas M, N and surrounding the macro cell 560.

The logic block 502 has a circuit row 540, a circuit row 542, a circuit row 544, a circuit row 546, a circuit row 548, a circuit row 550 and a circuit row 552. Each of the circuit rows 540, 542, 544, 546, 548, 520, 552 may have FETs and other logic elements along the circuit row. Each of the circuit rows 540, 542, 544, 546, 548, 520, 552 may have access to one of the Vdd power supply rails 510, 512, 514, 516 and to one of the Vss power supply rails 520, 522, 524, 526 as they may overlap the power supply rails. As shown in the embodiment of the logic block 502, circuitry along the circuit rows 540, 542 does not have an interruption of the circuit row due to a frontside to backside signal via.

The logic block 502 may have frontside to backside signal vias along edge cells of the logic block. The logic block 502 may have frontside to backside signal vias along edge cells of macro cell 560 within the logic block. The logic block 502 may not have frontside to backside signal vias in any other location within the logic block 502. Top/bottom edge cells are area I and area J of the logic block 502. Left/right edge cells of the logic block 202 are area K and area L.

In an embodiment, the logic block 502 may have hundreds of circuit rows, for example 600 circuit rows. In an embodiment, the logic block may contain hundreds of circuit rows, for example 600 circuit rows and have thousands FETs, for example 2,000 FETs or nanosheet FETs within each circuit row. In an embodiment, there may be as many Vdd power supply rails and as many Vss power supply rails, as the number of circuit rows, in the logic block 502. In an embodiment, an entire semiconductor device or chip may have a single logic block 502.

Within the logic block 502, all of the power supply rails, i.e. the Vdd power supply rails 510, 512, 514, 516 and the Vss power supply rails 520, 522, 524, 526 are continuous and do not have any breaks across the logic block 502 with the exception of an area surrounding the macro cell 560. There may be frontside to backside vias in the macro cell 560 edge cells, which may be within the logic block 502.

The advantages include power supply rails which are continuous through the logic block, except surrounding the macro cell 560, and forming a maximum amount of logic circuitry within the logic block.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:

a logic block, wherein the logic block comprises circuitry for one logic function of the semiconductor device;

a double diffusion break region arranged between a first nanosheet transistor device and a second nanosheet transistor device of the logic block, wherein a first gate structure of the first nanosheet transistor device surrounds a top surface, a bottom surface and an end surface of first channel nanosheets in the double diffusion break region, and a second gate structure of the second nanosheet transistor device surrounds a top surface, a bottom surface and an end surface of second channel nanosheets in the double diffusion break region; and a frontside to backside signal via vertically aligned and directly connecting a first backside metal signal to a first frontside metal signal, wherein the frontside to backside signal via passes through the double diffusion break region directly between the first gate structure and the second gate structure, wherein the frontside to backside signal via is only in an edge cell of the logic block.

2. The semiconductor device according to claim 1, wherein the logic block comprises a set of circuit rows, a set of backside metal Vdd power rails, a set of backside metal Vss power rails.

3. The semiconductor device according to claim 2, further comprising:

each backside metal Vdd power rail of the set of backside metal Vdd power rails is continuous with no breaks across the logic block; and each backside metal Vss power rail of the set of backside metal Vss power rails is continuous with no breaks across the logic block.

4. The semiconductor device according to claim 1, wherein the frontside to backside signal via is a nano through silicon via (nTSV).

5. The semiconductor device according to claim 1, further comprising:

the logic block comprises circuitry for a microprocessor device.

6. The semiconductor device according to claim 2, wherein the set of circuit rows comprises 1000 circuit rows.

7. The semiconductor device according to claim 1, further comprising:

a set of front side Vdd power rails and a set of front side Vss power rails.

8. A method comprising:

forming a logic block, wherein the logic block comprises circuitry for one logic function of a semiconductor device, wherein the logic block comprises a set of circuit rows, a set of backside metal Vdd power rails, a set of backside metal Vss power rails, and first edge cells arranged along a perimeter of the logic block;

forming a double diffusion break region between a first nanosheet transistor device and a second nanosheet transistor device of the logic block, wherein a first gate structure of the first nanosheet transistor device wraps around ends of first channel nanosheets in the double diffusion break region, and a second gate structure of the second nanosheet transistor device wraps around ends of second channel nanosheets in the double diffusion break region; and forming a frontside to backside signal via vertically aligned and directly connecting a first backside metal signal to a first frontside metal signal, wherein the frontside to backside signal via passes through the double diffusion break region directly between the first gate structure and the second gate structure, wherein the frontside to backside signal via is within the first edge cells.

9. The method according to claim 8, further comprising:

forming a macro cell within the logic block, wherein the macro cell comprises second edge cells arranged along a perimeter of the macro cell, wherein both the macro cell and the second edge cells are within the perimeter of the logic block; and forming a second frontside to backside signal via vertically aligned and directly connecting a second backside metal signal to a second frontside metal signal, wherein the second frontside to backside signal via is only within one of the second edge cells.

10. The method according to claim 9, wherein the logic block comprises a set of circuit rows, wherein at least one circuit row of the set of circuit rows is interrupted by the macro cell.

* * * * *